United States Patent
Oba et al.

(10) Patent No.: US 10,056,232 B2
(45) Date of Patent: Aug. 21, 2018

(54) CHARGED PARTICLE BEAM APPARATUS AND PLASMA IGNITION METHOD

(71) Applicant: HITACHI HIGH-TECH SCIENCE CORPORATION, Tokyo (JP)

(72) Inventors: Hiroshi Oba, Tokyo (JP); Yasuhiko Sugiyama, Tokyo (JP)

(73) Assignee: Hitachi High-Tech Science Corporation, Tokyo (JP)

( * ) Notice: Subject to any disclaimer, the term of this patent is extended or adjusted under 35 U.S.C. 154(b) by 0 days.

(21) Appl. No.: 15/468,676

(22) Filed: Mar. 24, 2017

(65) Prior Publication Data

US 2017/0278678 A1    Sep. 28, 2017

(30) Foreign Application Priority Data

Mar. 25, 2016  (JP) ................................. 2016-061917

(51) Int. Cl.
*H01J 7/24* (2006.01)
*H01J 37/32* (2006.01)
*H01J 37/244* (2006.01)

(52) U.S. Cl.
CPC ...... *H01J 37/32422* (2013.01); *H01J 37/244* (2013.01); *H01J 37/321* (2013.01); *H01J 37/3211* (2013.01); *H01J 37/3244* (2013.01); *H01J 37/3299* (2013.01); *H01J 37/32651* (2013.01)

(58) Field of Classification Search
CPC ................ H01J 37/321; H01J 37/3233; H01J 37/32064; H01J 2237/0807; H01J 2237/082

USPC ........................................ 315/111.21, 111.51
See application file for complete search history.

(56) References Cited

U.S. PATENT DOCUMENTS

| | | | |
|---|---|---|---|
| 7,732,759 B2 * | 6/2010 | Chen ................. | H01J 37/32357 216/67 |
| 2009/0250340 A1 * | 10/2009 | Sasaki ................. | H01J 37/3053 204/298.02 |
| 2011/0174606 A1 * | 7/2011 | Funk ................. | H01J 37/32009 204/164 |
| 2011/0198511 A1 | 8/2011 | Graupera et al. | |
| 2012/0056088 A1 * | 3/2012 | Rue ..................... | H01J 37/3005 250/307 |

(Continued)

FOREIGN PATENT DOCUMENTS

JP              204672 A      10/2011

*Primary Examiner* — Tung X Le
(74) *Attorney, Agent, or Firm* — Senniger Powers LLP

(57) ABSTRACT

A charged particle beam apparatus according to this invention includes: a gas introduction chamber, into which raw gas is introduced; a plasma generation chamber connected to the gas introduction chamber; a coil that is wound along an outer circumference of the plasma generation chamber and to which high-frequency power is applied; an electrode arranged at a boundary between the gas introduction chamber and the plasma generation chamber and having a plurality of through-holes formed therein; a plasma electrode that is provided apart from the electrode; a detection unit for detecting whether or not the plasma has been ignited in the plasma generation chamber; and a controller that controls, based on the result of detection by the detection unit, a voltage to be supplied to the plasma electrode in association with a predetermined pressure for supplying the raw gas.

6 Claims, 7 Drawing Sheets

(56) References Cited

U.S. PATENT DOCUMENTS

2013/0015765 A1* 1/2013 Graupera ............... H01J 37/08
  315/111.31
2016/0276134 A1* 9/2016 Collins ............... H01J 37/3255

* cited by examiner

| DETECTION | BEFORE | AFTER |
|---|---|---|
| GAS PRESSURE | IGNITION PRESSURE P1 (HIGH PRESSURE) | OPERATING PRESSURE P2 (LOW PRESSURE) |

CHARGED PARTICLE BEAM APPARATUS AND PLASMA IGNITION METHOD

CROSS-REFERENCE TO RELATED APPLICATION

This application claims priority from Japanese Patent Application No. 2016-061917, filed on Mar. 25, 2016, the entire subject matter of which is incorporated herein by reference.

BACKGROUND

1. Field of the Invention

The present invention relates to a charged particle beam apparatus and a plasma ignition method.

2. Description of Related Art

Conventionally, an ignition device for igniting a plasma by using a pulse voltage waveform in an inductively coupled plasma ion source has been proposed (for example, see JP-A-2011-204672).

In a plasma ignition device for a conventional inductively coupled plasma ion source, a plasma is ignited by using a pulse voltage waveform (for example, see JP-A-2011-204672).

By using the pulse voltage waveform, even if the initial voltage of the vibration waveform is a very high voltage, the total power per pulse is low. However, it was necessary to apply a high voltage as the initial voltage of the vibration waveform of the pulse.

SUMMARY

The present invention has been made in view of the above circumstances, and its object is to suppress the voltage required for plasma ignition to be low.

One aspect of the present invention provides a charged particle beam apparatus comprising: a gas introduction chamber, into which raw gas is introduced; a plasma generation chamber connected to the gas introduction chamber; a coil that is wound along an outer circumference of the plasma generation chamber and to which high-frequency power is applied; an electrode arranged at a boundary between the gas introduction chamber and the plasma generation chamber and having a plurality of through-holes formed therein; a plasma electrode that is provided apart from the electrode; a detection unit for detecting whether or not the plasma has been ignited in the plasma generation chamber; and a controller that controls, based on the result of detection by the detection unit, a voltage to be supplied to the plasma electrode in association with a predetermined pressure for supplying the raw gas.

In an aspect of the charged particle beam apparatus of the present invention, the predetermined pressure includes a first pressure when the detecting unit detects that the plasma has been ignited, and a second pressure lower than the first pressure, and when the detecting unit detects that the plasma has been ignited, the controller controls the pressure to change from the first pressure to the second pressure.

In an aspect of the charged particle beam apparatus of the present invention, if a voltage, which is supplied to the plasma electrode when the plasma is ignited, is applied to the raw gas before ignition from the plasma electrode, the second pressure is a pressure in a range where the ignition condition of the raw gas is not satisfied.

In an aspect of the charged particle beam apparatus of the present invention, the controller controls the voltage in association with the predetermined pressure while the voltage is in a range from a lower limit value of a sparking voltage based on Paschen's Law or more to twice the lower limit value or less.

In an aspect of the charged particle beam apparatus of the present invention, the apparatus further comprises a shield provided between the plasma generating chamber and the coil, and the electrode is a floating electrode.

Another aspect of the present invention provides a plasma ignition method using a charged particle beam apparatus, wherein the charged particle beam apparatus comprises a gas introduction chamber, into which raw gas is introduced; a plasma generation chamber connected to the gas introduction chamber; a coil that is wound along an outer circumference of the plasma generation chamber and to which high-frequency power is applied; an electrode arranged at a boundary between the gas introduction chamber and the plasma generation chamber and having a plurality of through-holes formed therein; and a plasma electrode that is provided apart from the electrode, said plasma ignition method comprising: detecting whether or not the plasma has been ignited in the plasma generation chamber; and based on the result to be detected from the detecting, controlling a voltage to be supplied to the plasma electrode in association with a predetermined pressure for supplying the raw gas.

According to the present invention, the voltage required to ignite the plasma can be suppressed low.

DETAILED DESCRIPTION

Hereinafter, a charged particle beam apparatus and a plasma ignition method according to embodiments of the present invention will be described with reference to the accompanying drawings.

Figure 1:
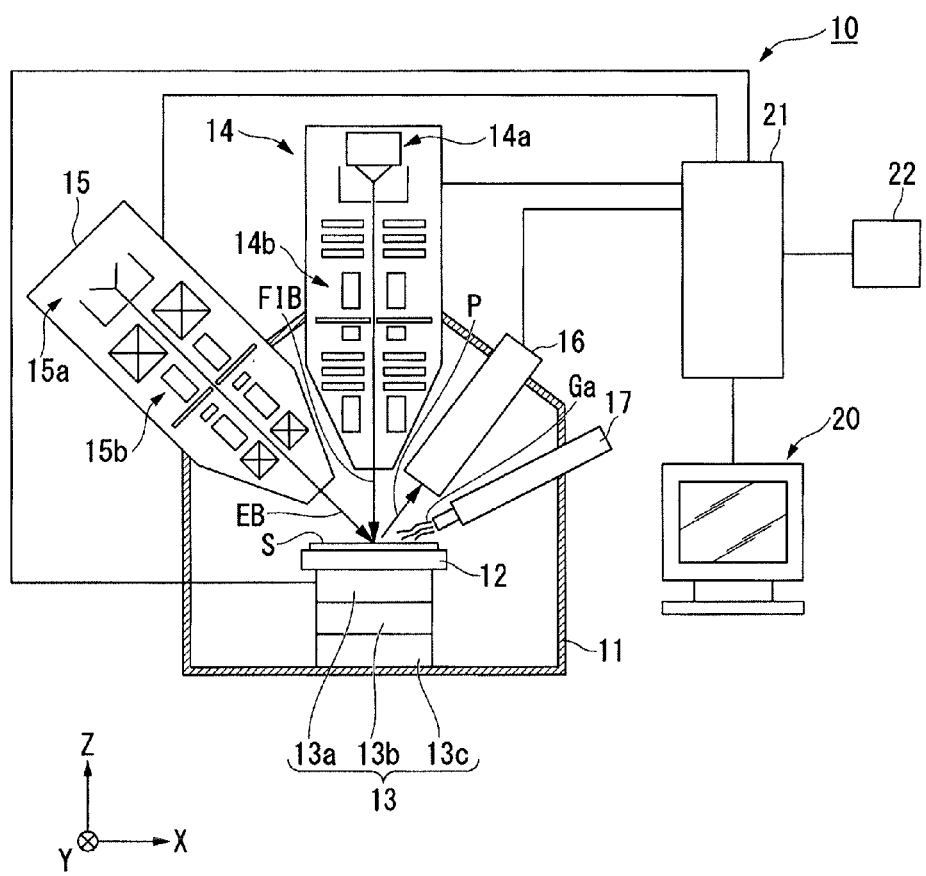
FIG. 1 is a schematic cross-sectional view showing the configuration of a charged particle beam apparatus according to an embodiment of the present invention.

A charged particle beam apparatus 10 according to the present embodiment includes a sample chamber 11, the inside of which is able to be maintained in a vacuum state, a stage 12 for being able to fix a sample S in the sample chamber 11, and an actuator 13 that actuates the stage 12, as shown in FIG. 1. The charged particle beam apparatus 10 includes a focused ion beam lens barrel 14 for irradiating focused ion beams FIB to an irradiated subject in a predetermined irradiation area (that is, a scan range) in the sample chamber 11. The charged particle beam apparatus 10 includes an electron beam barrel 15 for irradiating electron beams EB to the irradiated subject in the predetermined irradiation area in the sample chamber 11. The charged particle beam apparatus 10 includes a detector 16 for detecting secondary charged particles (secondary electrons or secondary ions) P generated from the irradiated subject by irradiation of the focused ion beams or electron beams. The charged particle beam apparatus 10 includes a detector (not shown) for detecting secondary charged particles (reflected electrons) generated from the irradiated subject by irradiation of electron beams in the electron beam barrel 15. The charged particle beam apparatus 10 includes a gas supply unit 17 for supplying gas Ga to a surface of the irradiated subject. The charged particle beam apparatus 10 includes a display device 20 for displaying image data, etc. based on secondary charged particles detected by the detector 16, a controller 21 and an input device 22.

The charged particle beam apparatus 10 may perform various processes (etching process, etc.) through sputtering and form a deposition film by scanning and irradiating the focused ion beams onto the surface of the irradiated subject. The charged particle beam apparatus 10 may perform a process of forming, in the sample S, a cross section for cross-section observation through a scanning-type electron microscope and a process of forming from the sample S a sample piece (for example, a thin piece sample, a needle-shaped sample, etc.) for transmission observation through a transmission-type electron microscope. The charged particle beam apparatus 10 may scan and irradiate the focused ion beams or electron beams onto the surface of the irradiated subject such as the sample S, thereby observing the surface of the irradiated surface.

The sample chamber 11 is configured in such a way that it can be evacuated until the inside thereof becomes a desired vacuum state by an exhaust device (not shown) and maintain the desired vacuum state.

The stage 12 holds the sample S.

The actuator 13 is housed in the sample chamber 11 in a state of being connected to the stage 12 and displaces the stage 12 with respect to a predetermined axis according to a control signal output from the controller 21. The actuator 13 includes a movement mechanism 13a for moving the stage 12 in parallel along X and Y axes parallel to a horizontal plane and orthogonal to each other and a Z axis of a vertical direction orthogonal to the X and Y axes. The actuator 13 includes a tilt mechanism 13b for rotating the stage 12 around the X axis or Y axis and a rotation mechanism 13c for rotating the stage 12 around the Z axis.

The focused ion beam lens barrel 14 is fixed to the sample chamber 11 such that a beam emission unit (not shown) faces the stage 12 at an upper side of the stage 12 in a vertical direction within the irradiation area in the sample chamber 11 and an optical axis thereof is parallel to the vertical direction. Thus, focused ion beams can be irradiated to the irradiated subject such as the sample S fixed on the stage 12 downward from upper side of the vertical direction.

The focused ion beam barrel 14 includes a plasma ion source 14a for generating ions and an ion optical system 14b for focusing and deflecting the ions drawn from the plasma ion source 14a. The plasma ion source 14a and the ion optical system 14b are controlled according to a control signal output from the controller 21 and the irradiation position and irradiation condition of the focused ion beam are controlled by the controller 21. The ion optical system 14b includes a first electrostatic lens such as a condenser lens, an electrostatic deflector, a second electrostatic lens such as an objective lens and the like, for example. Although two sets of electrostatic lenses are shown in FIG. 1, three sets or more of electrostatic lenses may be provided. In this case, an aperture is provided between the lenses.

Figure 2:
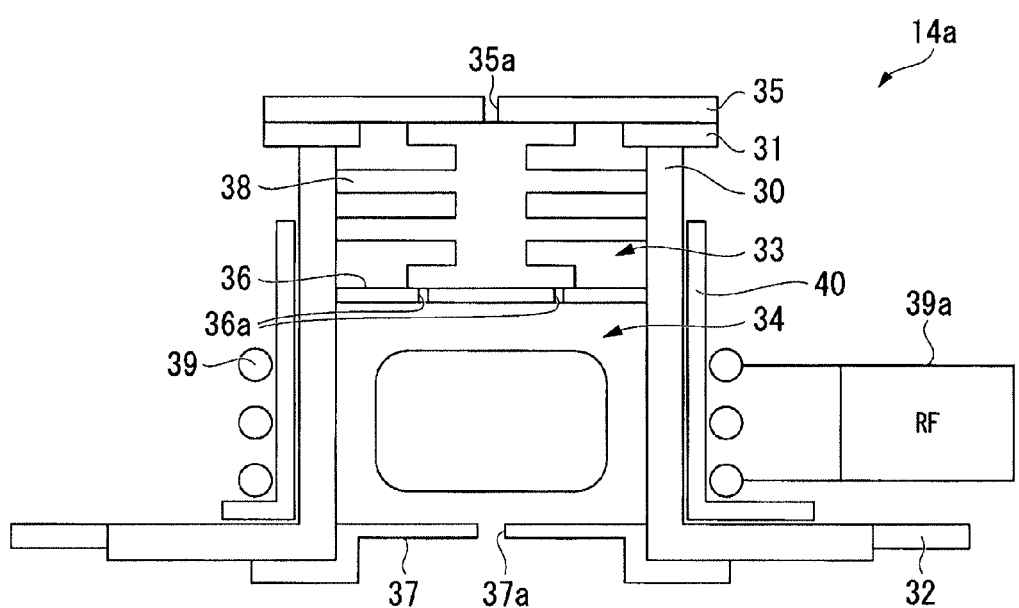
FIG. 2 is a schematic cross-sectional view showing the configuration of a plasma ion source according to an embodiment of the present invention.
Figures 5, 6:
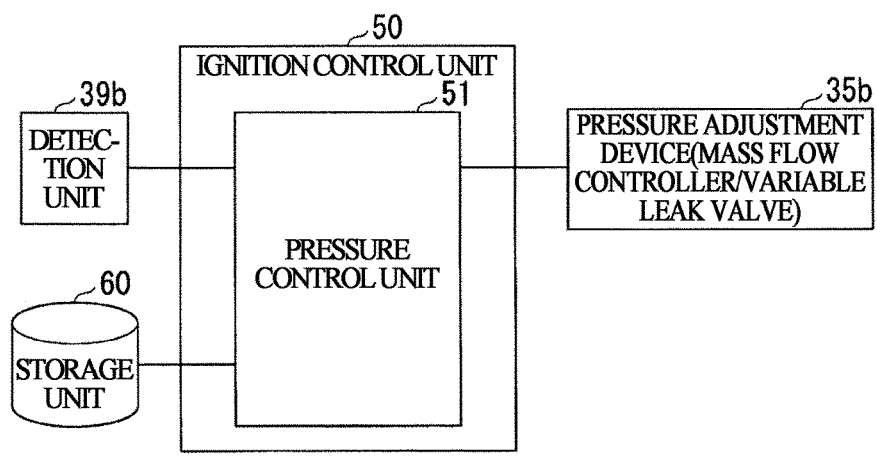
FIG. 5 is a schematic block diagram showing the configuration of an ignition control unit according to an embodiment of the present invention.
FIG. 6 is a view showing an example of gas pressures, before and after plasma is ignited, stored in a storage unit shown in FIG. 5.

The plasma ion source 14a is a high-frequency inductively-coupled plasma ion source. The plasma ion source 14a includes a torch 30, a first ground potential flange 31, a second ground potential flange 32, a gas introduction chamber 33, a plasma generation chamber 34, a gas introduction chamber member 35, a terminal electrode 36, a plasma electrode 37, an insulation member 38, a coil 39 and a Faraday shield 40, as shown in FIG. 2 and an ignition control unit 50 and a storage unit 60, as shown in FIG. 5.

The torch 30 has a tube shape. The torch 30 is made of a dielectric material. The dielectric material may be any one of quartz glass, alumina and aluminum nitride, for example. In a first end of the torch 30, the first ground potential flange 31 is provided. In a second end of the torch 30, the second ground potential flange 32 is provided. The first ground potential flange 31 and the second ground potential flange 32 are maintained at a ground potential. The first ground potential flange 31 and the second ground potential flange 32 are made of nonmagnetic metal such as copper or aluminum, for example.

The torch 30 forms the gas introduction chamber 33 and the plasma generation chamber 34. The gas introduction chamber 33 is formed by the gas introduction chamber member 35 connected to the first ground potential flange 31 and the terminal electrode 36 provided in the torch 30. The plasma generation chamber 34 is formed by the terminal electrode 36 and the plasma electrode 37 provided at the second end of the torch 30. The terminal electrode 36 and the plasma electrode 37 are made of nonmagnetic metal such as copper, tungsten, and molybdenum. Since plasma is attached to the inner wall of the torch 30 by sputtering the terminal electrode 36 and the plasma electrode 37, tungsten or molybdenum having high energy necessary for sputtering is preferable. The terminal electrode 36 is a floating electrode. The insulation member 38 is housed in the gas introduction chamber 33.

The coil 39 wound along the outer circumference of the plasma generation chamber 34 is provided outside the torch 30. High-frequency power is supplied from an RF power source 39a to the coil 39. In addition, as shown in FIG. 5, a detection unit 39b is connected to the coil 39. The detection unit 39b detects whether or not the plasma has been ignited inside the plasma generation chamber 34. The detection unit 39b detects the ignition of the plasma by detecting a change in impedance of the coil 39.

The Faraday shield 40 is provided between the torch 30 and the coil 39. The Faraday shield 40 is an electrically conductive and nonmagnetic cylindrical member provided with slits on the side surfaces thereof. The Faraday shield 40 can reduce the capacitive coupling component of the coil 39 and the plasma. Therefore, the Faraday shield 40 can reduce the spreading of energy of the ion beam. In other words, by using the Faraday shield 40, the charged particle beam apparatus 10 can narrow the ion beam finely.

In the gas introduction chamber member 35, an opening 35a for introducing raw gas supplied from a gas supply source (not shown) via a flow controller (not shown) or a pressure adjustment device 35b shown in FIG. 5 into the gas introduction chamber 33 is formed. The pressure adjustment device 35b is a device for regulating the pressure of the raw gas. Specifically, the pressure adjustment device 35b is a mass flow controller or a variable leak valve.

In the terminal electrode 36 provided at the boundary between the gas introduction chamber 33 and the plasma generation chamber 34, a plurality of through-holes 36a for introducing the raw gas from the gas introduction chamber 33 to the plasma generation chamber 34 is formed. The size R of each of the plurality of through-holes 36a (for example, the diameter of the circular through-hole 36a) is smaller than the length of a plasma sheath. The length of the plasma sheath is several tens of micrometer to several hundreds of micrometer, for example.

The plasma electrode 37 is provided with an opening 37a through which ions are extracted from the plasma generation chamber 34 to the outside.

Figure 3:
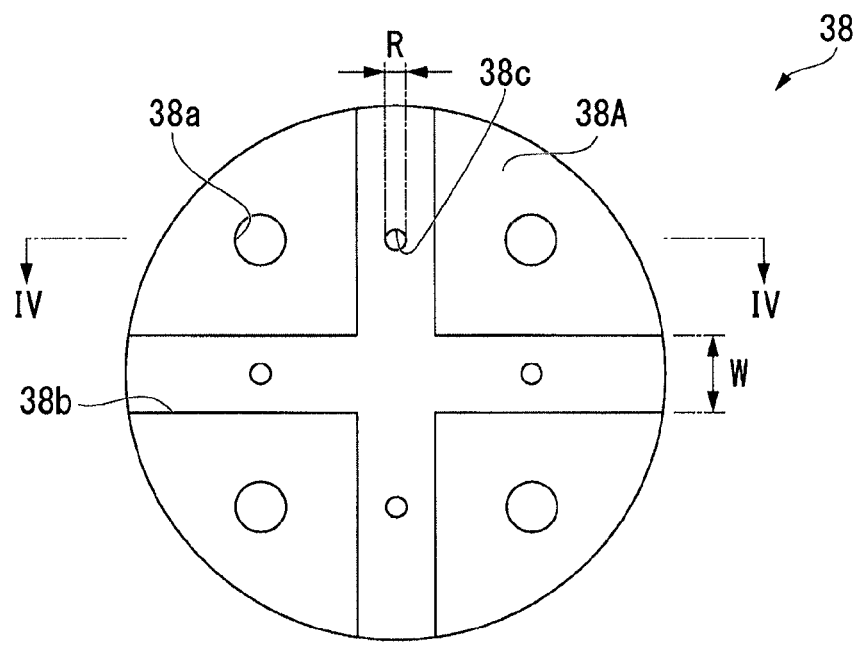
FIG. 3 is a plan view showing an insulation member of a plasma ion source according to an embodiment of the present invention when viewed from a plasma generation chamber side.
Figure 4:
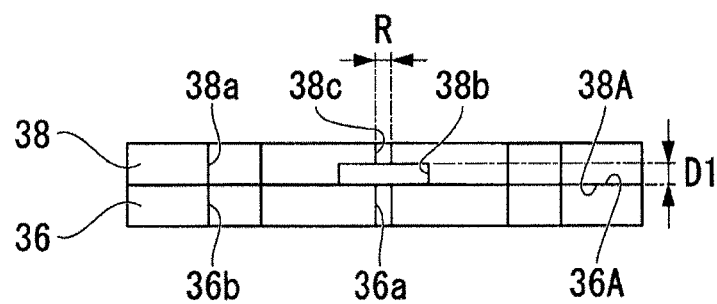
FIG. 4 is a cross-sectional view of an insulation member and a terminal electrode taken along a IV-IV line shown in FIG. 3.

The insulation member 38 of the gas introduction chamber 33 is fixed to the terminal electrode 36 by connection members such as bolts. As shown in FIG. 3, mounting holes 38a, in which connection members (not shown) are mounted, are formed in the insulation member 38. In an opposite surface 38A of the insulation member 38 facing a surface 36A of the terminal electrode 36, as shown in FIG. 4, a concave groove 38b is formed. The depth D1 of the concave groove 38b is smaller than the length of the plasma sheath. The width W of the concave groove 38b is greater than the depth D1. In the insulation member 38, a plurality of through-holes 38c provided in the concave groove 38b are formed. The size of each of the plurality of through-holes 38c (for example, the diameter of the circular through-hole 38c, etc.) is smaller than the length of the plasma sheath. The size of each of the plurality of through-holes 38c is equal to the size R of each of the plurality of through-holes 36a in the terminal electrode 36, for example. Each of the plurality of through-holes 38c is located to face each of the plurality of through-holes 36a in the terminal electrode 36, for example.

In addition, in the terminal electrode 36, a mounting hole 36b, in which a connection member (not shown) is mounted, is formed to face the mounting hole 38a of the insulation member 38.

The insulation member 38 is shaped to prevent direct movement of charged particles between the gas introduction chamber member 35 and the terminal electrode 36. The insulation member 38 is shaped such that the gas introduction chamber member 35 and the terminal electrode 36 are not directly visible to each other. The insulation member 38 has a male thread shape, for example.

The pressure of the plasma generation chamber 34 is set to about 0.1 Pa to 10 Pa. Since high conductance is set between the plasma generation chamber 34 and the gas introduction chamber 33 by the terminal electrode 36 in which the plurality of through-holes 36a are formed, the pressure of the gas introduction chamber 33 is substantially equal to that of the plasma generation chamber 34. The pressure of the plasma generation chamber 34 is controlled according to the flow of the raw gas introduced from the gas supply source (not shown) to the gas introduction chamber 33. The flow controller (not shown) controls the flow rate of the raw gas introduced into the gas introduction chamber 33 to set the pressure of the plasma generation chamber 34 to desired pressure.

As shown in FIG. 5, the ignition control unit 50 has a pressure control unit 51. The pressure control unit 51 is connected to the detection unit 39b. Further, the pressure control unit 51 is connected to the storage unit 60. Further, the pressure control unit 51 is connected to the pressure adjustment device 35b.

As shown in FIG. 6, the storage unit 60 stores gas pressure information. The gas pressure information includes information on the gas pressure to be set before the detection unit 39b detects the ignition of the plasma and after the detection unit 39b detects the ignition of the plasma. Further, the gas pressure information includes gas pressure information corresponding to the type of the raw gas supplied from the gas supply source. Specifically, an ignition pressure P1 is stored in the storage unit 60. The ignition pressure P1 is a gas pressure to be supplied by the pressure adjustment device 35b before ignition of the plasma is detected. Further, in the storage unit 60, an operation pressure P2 is stored. The operation pressure P2 is a gas pressure to be supplied by the pressure adjustment device 35b after ignition of the plasma has been detected.

The ignition pressure P1 and the operation pressure P2 are predetermined in accordance with Paschen's Law. Paschen's Law shows a relationship between the sparking voltage and (pressure×inter-electrode distance). The inter-electrode distance is determined in advance by arrangement of components of the charged particle beam apparatus 10.

Before the plasma is ignited, the pressure control unit 51 acquires the ignition pressure P1 from the storage unit 60. The pressure control unit 51 issues an instruction to the pressure adjustment device 35b to adjust the pressure of the raw gas to be supplied to the ignition pressure P1.

The pressure adjustment device 35b adjusts the pressure of the raw gas to be supplied to the ignition pressure P1. The pressure of the plasma generating chamber 34 is adjusted to the ignition pressure P1.

Figure 7:
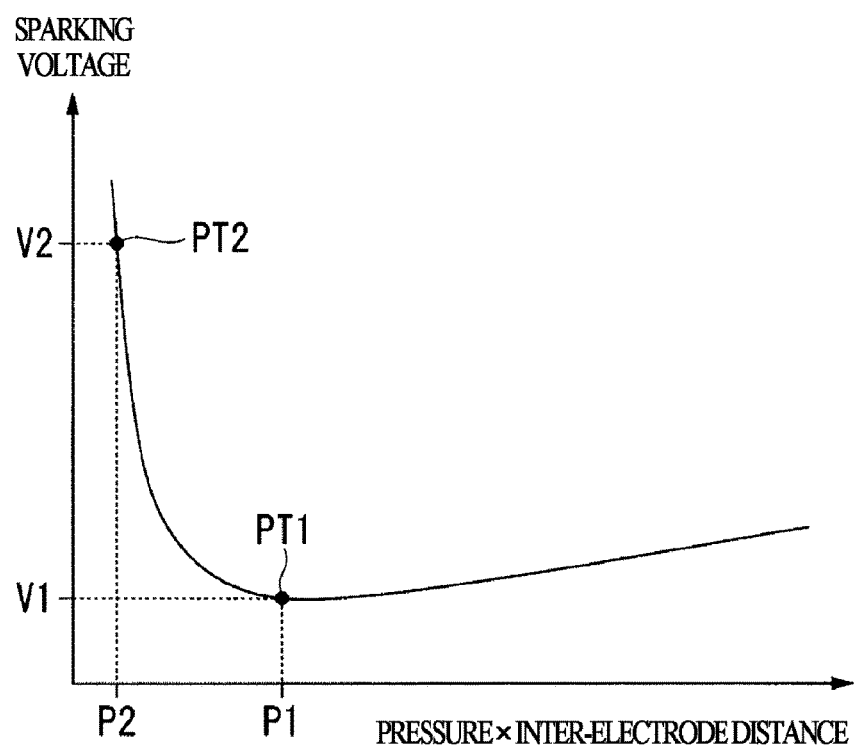
FIG. 7 is a view showing a relationship between a sparking voltage and (pressure×inter-electrode distance) based on Paschen's Law according to an embodiment of the present invention.

The ignition pressure P1 is a pressure at which plasma can be ignited by a desired spark voltage V1 indicated by the high pressure region PT1 (sparking voltage V1, ignition pressure P1). Specifically, as shown in FIG. 7, the high pressure region PT1 is a pressure on the region side where the sparking voltage is low based on Paschen's Law.

In the above description, the pressure control unit 51 has acquired the ignition pressure P1 and the operation pressure P2 from the storage unit 60. However, the pressure control unit 51 may calculate the ignition pressure P1 and the operation pressure P2 without acquiring them from the storage unit 60. In other words, the pressure control unit 51 may calculate the pressures of the raw gas to be supplied, that is, the ignition pressure P1 and the operating pressure P2, based on Paschen's Law from the type of the raw gas and the voltage (sparking voltage) to be applied to the plasma electrode 37.

The plasma ion source 14a applies a desired voltage to the plasma electrode 37. A spark is caused to fly between the plasma electrode 37 to which a desired voltage is applied and the terminal electrode 36, whereby the plasma is ignited.

The electron beam barrel 15 is fixed to the sample chamber 11 such that a beam emission unit (not shown) faces the stage 12 in an inclination direction inclined at a predetermined angle from the vertical direction of the stage 12 within the irradiation area in the sample chamber 11 and an optical axis thereof is parallel to the inclination direction. Thus, the electron beams may be irradiated to the irradiated subject such as the sample S fixed on the stage 12 from the upper side to the lower side of the inclination direction.

The electron beam barrel 15 includes an electron source 15a for generating electrons and an electronic optical system 15b for focusing and deflecting the electrons emitted from the electron source 15a. The electron source 15a and the electronic optical system 15b are controlled according to a control signal output from the controller 21, and the irradiation position, irradiation condition and the like of the electron beams are controlled by the controller 21. The electronic optical system 15b includes, for example, an electromagnetic lens and a deflector.

The electron beam barrel 15 and the focused ion beam barrel 14 may be exchangeably arranged, such that the electron beam barrel 15 is arranged in the vertical direction and the focused ion beam barrel 14 is arranged in the inclination direction inclined at the predetermined angle from the vertical direction.

When the focused ion beams or the electron beams are irradiated to the irradiated subject such as the sample S, the detector 16 detects the intensity of secondary charged particles (secondary electrons, secondary ions, and the like) P (that is, the amount of secondary charged particles) radiated from the irradiated subject and outputs information on the amount of detected secondary charged particles P. The detector 16 is located at a position where the amount of secondary charged particles P is capable of being detected in the sample chamber 11, for example, at a diagonally upper position of the irradiated subject such as the sample S within the irradiated area, and is fixed to the sample chamber 11.

The gas supply unit 17 is fixed to the sample chamber 11 such that a gas spraying unit (not shown) faces the stage 12 in the sample chamber 11. The gas supply unit 17 may supply, to the sample S, etching gas for selectively facilitating etching of the sample S by the focused ion beams according to the material of the sample S, deposition gas for forming a deposition film by a deposited material such as metal or insulator on the surface of the sample S, and the like. For example, etching gas such as xenon fluoride for an Si-based sample S, vapor for an organic-based sample S, or the like is supplied to the sample S while irradiating the focused ion beams, thereby selectively facilitating etching. For example, deposition gas of compound gas containing phenanthrene, platinum, carbon, tungsten or the like is supplied to the sample S while irradiating the focused ion beams, thereby depositing a solid component decomposed from the deposition gas on the surface of the sample S.

The controller 21 is arranged outside the sample chamber 11 and is connected to the display device 20 and the input device 22 such as a mouse and a keyboard for outputting a signal according to input operation of an operator.

The controller 21 integrally controls operation of the charged particle beam apparatus 10 by a signal output from the input device 22 or a signal generated by a predetermined automatic operation control process.

The controller 21 converts the amount of secondary charged particles detected by the detector 16 while scanning the irradiation position of the charged particle beam into a luminance signal corresponding to the irradiation position and generates image data indicating the shape of the irradiated subject by two-dimensional position distribution of the amount of detected secondary charged particles. The controller 21 displays, along with each generated image data, a screen for executing operations such as enlargement, reduction, movement and rotation of each image data on the display device 20. The controller 21 displays a screen for performing a variety of settings such as processing settings on the display device 20.

As described above, according to the charged particle beam apparatus 10 according to the embodiment of the present invention, the ignition control unit 50 controls the pressure of the raw gas to be supplied, to the ignition pressure P1 according to the voltage to be applied to the plasma electrode 37. The ignition pressure P1 is the pressure on the region side where the sparking voltage is low based on Paschen's Law. Therefore, it is possible to suppress the voltage required to ignite plasma to be low.

In the above-described embodiment, the plasma ion source 14a includes the Faraday shield 40, but the Faraday shield 40 is not indispensable. In the above-described embodiment, the terminal electrode 36 is a floating electrode, but it is not limited thereto, and the terminal electrode 36 may be an electrode whose potential is fixed to a certain potential. That is, it is not indispensable that the terminal electrode 36 is a floating electrode.

[Example of Operation of Ignition Control Unit 50 after Plasma Ignition]

Up to this point, an example of the operation of the ignition control unit 50 before the ignition of the plasma has been described. Next, an example of the operation of the ignition control unit 50 after the ignition of the plasma will be described.

As described above, the charged particle beam apparatus 10 supplies the raw gas adjusted to the ignition pressure P1 before the plasma ignition. The charged particle beam apparatus 10 applies a voltage to the plasma electrode 37 to ignite the plasma. In the charged particle beam apparatus 10, after the plasma has been ignited, the voltage to be applied to the plasma electrode 37 does not change from the sparking voltage V1.

When the detection unit 39b detects the ignition of the plasma, the ignition control unit 50 acquires the operation pressure P2 from the storage unit 60. The operating pressure P2 is the gas pressure after detection of ignition of the plasma as shown in FIG. 6. The pressure control unit 51 issues an instruction to change the pressure to supply the raw gas to the pressure adjustment device 35b. The pressure adjustment device 35b adjusts the pressure of the raw gas to be supplied, to the operating pressure P2. The pressure of the plasma generating chamber 34 is adjusted to the operating pressure P2. More specifically, the operating pressure P2 is an operating pressure indicated by the low pressure region PT 2 (sparking voltage V2, operating pressure P2) as shown in FIG. 7. The operating pressure P2 is lower than the ignition pressure P1.

Thereafter, a predetermined voltage serving as the acceleration energy of the ion beam is applied to the plasma electrode 37, and an acceleration voltage is applied to the plasma. A voltage is applied to an extraction electrode (not shown) for extracting ions from the plasma, and a focused ion beam is generated by a focusing lens at a subsequent stage.

That is, the charged particle beam apparatus 10 supplies the raw gas by the pressure of the operating pressure P2. The charged particle beam apparatus 10 maintains the ignited plasma by supplying the source gas by the pressure of the operating pressure P2. When the source gas is supplied by the pressure of the ignition pressure P1, the charged particle beam apparatus 10 degrades the performance of the focused ion beam such that the acceleration voltage applied to the plasma electrode 37 cannot be maintained (the ignited plasma disappears unstably).

[Operation Procedure of Ignition Control Unit 50]

Figure 8:
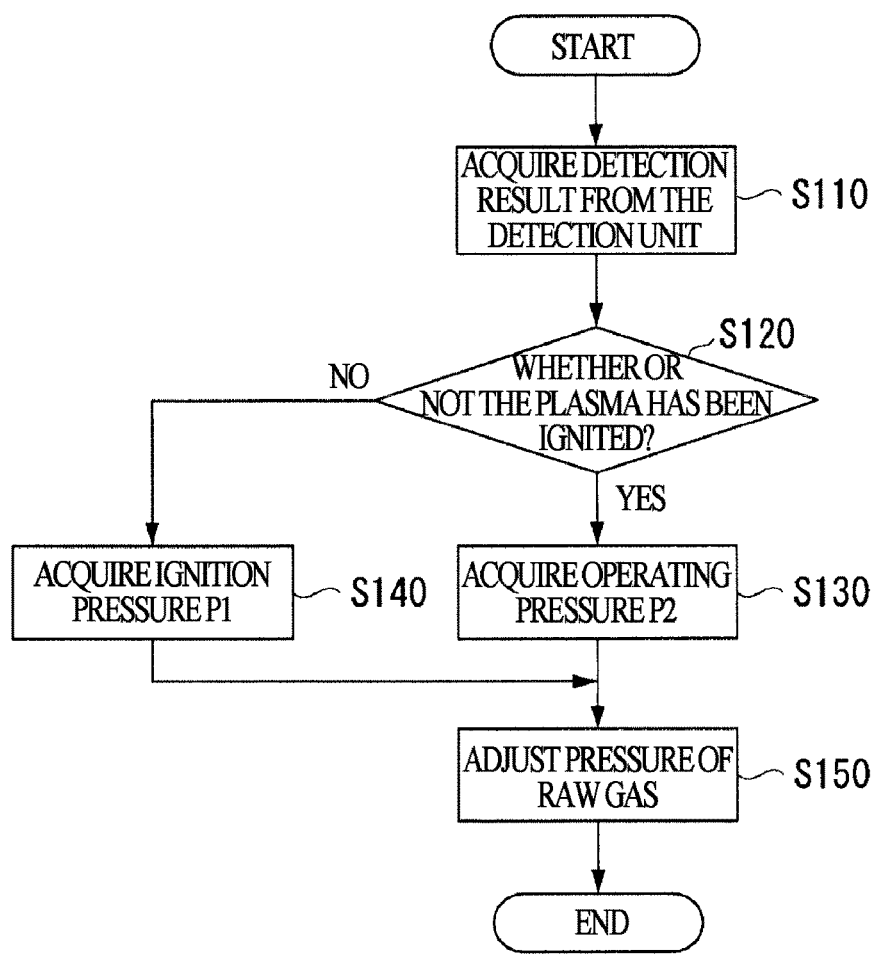
FIG. 8 is a flowchart showing an example of a process of an ignition control unit according to an embodiment of the present invention.

Next, the operation procedure of the ignition control unit 50 will be described with reference to FIG. 8.

The ignition control unit 50 acquires from the detection unit 39b a detection result as to whether or not the plasma has been ignited (step S110). The ignition control unit 50 determines a pressure to be acquired from the storage unit 60 depending on whether or not the plasma has been ignited (step S120). When the plasma has been ignited, the ignition control unit 50 acquires the operating pressure P2 (step S130). When the plasma has not been ignited, the ignition control unit 50 acquires the ignition pressure P1 (step S140). The ignition control unit 50, to the pressure adjustment device 35b, issues an instruction on the gas pressure. The pressure adjustment device 35b adjusts the pressure of the raw gas to be supplied, to a pressure instructed by the ignition control unit 50 (step S150).

Figure 9:
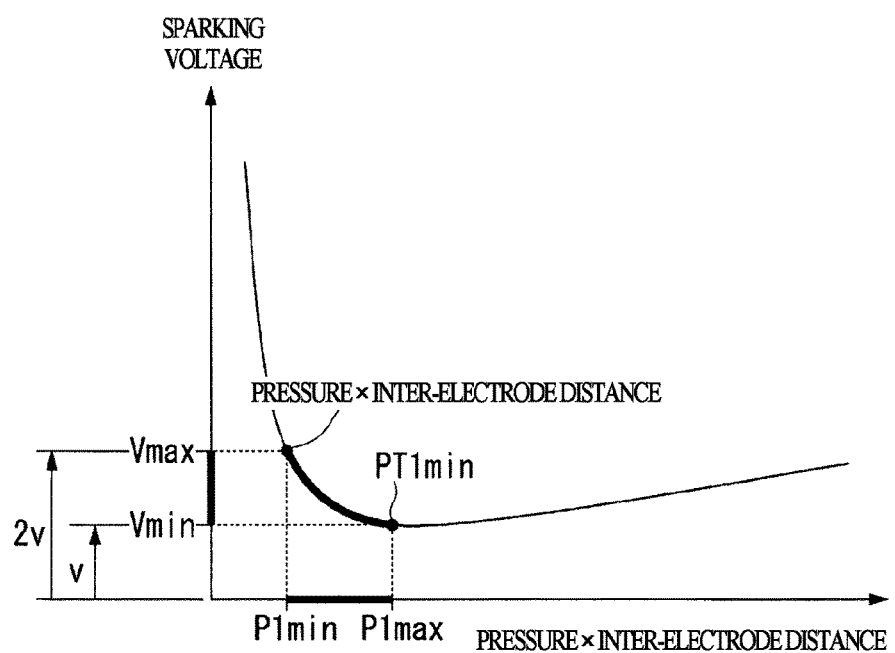
FIG. 9 is a view showing a range of pressure to be controlled by a pressure control unit according to an embodiment of the present invention.

In addition, the pressure control unit 51 adjusts the pressure of the raw gas to be supplied before plasma ignition so that it is in a range from a lower limit value of a sparking voltage based on Paschen's Law or more to twice the lower limit value or less. More specifically, as shown in FIG. 9, the pressure control unit 51 adjusts the pressure so that it is in a range from a high pressure region PT1min (sparking voltage Vmin, ignition pressure P1max) which is the lower limit value of the sparking voltage based on the Paschen's Law or more to a high pressure region PT1max (sparking voltage Vmax, ignition pressure P1min) or less. In other words, the pressure control unit 51 adjusts the pressure of the raw gas to be supplied so that it is within the range from the ignition pressure P1max or more to the ignition pressure P1min or less.

Incidentally, in the embodiment described above, description on the case that the ignition control unit 50 adjusts the pressure of the raw gas while the voltage applied to the plasma electrode 37 has been given. The ignition control unit 50 may be configured to maintain the pressure of the raw gas constant and have a voltage control unit (not shown) for adjusting the voltage to be applied to the plasma electrode 37.

Further, the Faraday shield 40 may be provided a switch (not shown) for switching the electric potential. The switch switches the electric potential of the Faraday shield 40 into the ground potential and an electric potential to be applied to the plasma electrode 37. In this case, if the potential of the Faraday shield 40 is the ground potential, it serves as a shield. If the potential of the Faraday shield 40 is a potential to be applied to the plasma electrode 37, it serves as the plasma electrode 37.

Further, plasma may be ignited by irradiating a laser to the torch 30.

As described above, according to the charged particle beam apparatus 10 according to an embodiment of the present invention, after the plasma has been ignited, the ignition control unit 50 controls the pressure of the raw gas to be supplied, under the operating pressure P2 in accordance with a voltage to be applied to the plasma electrode 37. The operating pressure P2 is a pressure on the region side where the sparking voltage is high based on Paschen's Law. Therefore, even after the plasma has been ignited, it is possible to maintain the plasma.

In addition, in the above-described embodiment, the electron beam barrel 15 may be omitted.

In the above-described embodiment, the controller 21 may be a software functional unit or a hardware functional unit such as LSI.

The above embodiments have been presented by way of example only, and are not intended to limit the scope of the invention. These novel embodiments described herein may be embodied in various other forms and various omissions, substitutions, or changes can be made without departing from the scope of the invention. These embodiments and their modifications would fall within the scope and spirit of the invention and are included in the scope of the invention as described in the appended claims and their equivalents.

LIST OF REFERENCE NUMERALS

10 . . . charged particle beam device
11 . . . sample chamber
12 . . . stage
13 . . . actuator
14 . . . focused ion beam lens barrel
14a . . . plasma ion source
15 . . . electron beam barrel
16 . . . detector
17 . . . gas supply unit
20 . . . display device
21 . . . controller
22 . . . input device
30 . . . torch
31 . . . first ground potential flange
32 . . . second ground potential flange
33 . . . gas introduction chamber
34 . . . plasma generation chamber
35 . . . gas introduction chamber member
36 . . . terminal electrode
37 . . . plasma electrode
38 . . . insulation member
39 . . . coil
40 . . . Faraday shield

What is claimed is:

1. A charged particle beam apparatus comprising:
   a gas introduction chamber, into which raw gas is introduced;
   a plasma generation chamber connected to the gas introduction chamber;
   a coil that is wound along an outer circumference of the plasma generation chamber and to which high-frequency power is applied;
   an electrode arranged at a boundary between the gas introduction chamber and the plasma generation chamber and having a plurality of through-holes formed therein;
   a plasma electrode that is provided apart from the electrode;
   a detection unit for detecting whether or not the plasma has been ignited in the plasma generation chamber; and
   a controller that controls, based on the result of detection by the detection unit, a voltage to be supplied to the plasma electrode in association with a predetermined pressure for supplying the raw gas.

2. The charged particle beam apparatus according to claim 1, wherein the predetermined pressure includes a first pressure when the detecting unit detects that the plasma has been ignited, and a second pressure lower than the first pressure, and wherein when the detecting unit detects that the plasma has been ignited, the controller controls the pressure to change from the first pressure to the second pressure.

3. The charged particle beam apparatus according to claim 2, wherein if a voltage, which is supplied to the plasma electrode when the plasma is ignited, is applied to the raw gas before ignition from the plasma electrode, the second pressure is a pressure in a range where the ignition condition of the raw gas is not satisfied.

4. The charged particle beam apparatus according to claim 1, wherein the controller controls the voltage in association with the predetermined pressure while the voltage is in a range from a lower limit value of a sparking voltage based on Paschen's Law about the raw gas or more to twice the lower limit value or less, and wherein the Paschen's Law shows a relationship between a sparking voltage and a pressure times inter-electrode distance.

5. The charged particle beam apparatus according to claim 1, further comprising a shield provided between the plasma generating chamber and the coil, wherein the electrode is a floating electrode.

6. A plasma ignition method using a charged particle beam apparatus, wherein the charged particle beam apparatus comprises:
- a gas introduction chamber, into which raw gas is introduced;
- a plasma generation chamber connected to the gas introduction chamber;
- a coil that is wound along an outer circumference of the plasma generation chamber and to which high-frequency power is applied;
- an electrode arranged at a boundary between the gas introduction chamber and the plasma generation chamber and having a plurality of through-holes formed therein; and
- a plasma electrode that is provided apart from the electrode, said plasma ignition method comprising:
  - detecting whether or not the plasma has been ignited in the plasma generation chamber; and
  - based on the result to be detected from the detecting, controlling a voltage to be supplied to the plasma electrode in association with a predetermined pressure for supplying the raw gas.

* * * * *